United States Patent
Sawada et al.

(10) Patent No.: US 9,467,194 B2
(45) Date of Patent: Oct. 11, 2016

(54) HIGH FREQUENCY CIRCUIT DEVICE

(71) Applicant: Hitachi Kokusai Electric Inc., Tokyo (JP)

(72) Inventors: Wataru Sawada, Tokyo (JP); Takahiro Miura, Tokyo (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 0 days.

(21) Appl. No.: 14/779,758

(22) PCT Filed: Mar. 13, 2014

(86) PCT No.: PCT/JP2014/056684
§ 371 (c)(1),
(2) Date: Sep. 24, 2015

(87) PCT Pub. No.: WO2014/156683
PCT Pub. Date: Oct. 2, 2014

(65) Prior Publication Data
US 2016/0087671 A1   Mar. 24, 2016

(30) Foreign Application Priority Data
Mar. 28, 2013 (JP) ................. 2013-069113

(51) Int. Cl.
| | |
|---|---|
| H04B 1/40 | (2015.01) |
| H01P 1/30 | (2006.01) |
| H01L 23/04 | (2006.01) |
| H01L 23/00 | (2006.01) |
| H01L 23/40 | (2006.01) |
| H01P 5/08 | (2006.01) |
| H04B 3/52 | (2006.01) |
| H04B 1/3888 | (2015.01) |
| H01L 23/66 | (2006.01) |

(52) U.S. Cl.
CPC .............. *H04B 1/40* (2013.01); *H01L 23/04* (2013.01); *H01L 23/4006* (2013.01); *H01L 23/562* (2013.01); *H01P 1/30* (2013.01); *H01P 5/08* (2013.01); *H04B 1/3888* (2013.01); *H04B 3/52* (2013.01); *H01L 23/66* (2013.01); *H01L 2223/6627* (2013.01); *H01L 2223/6683* (2013.01); *H01L 2924/1423* (2013.01); *H01L 2924/167* (2013.01)

(58) Field of Classification Search
CPC ........................................................ H04B 1/40
USPC .............. 361/679.01, 679.02, 728, 730, 748, 361/752, 759, 732, 757
See application file for complete search history.

(56) References Cited

U.S. PATENT DOCUMENTS

| | | | | | |
|---|---|---|---|---|---|
| 7,286,372 | B2* | 10/2007 | Aronson | .............. | H05K 9/0058 174/260 |
| 8,085,187 | B2* | 12/2011 | Gard | .................... | G01F 23/284 342/124 |
| 2011/0051375 | A1* | 3/2011 | Ammar | ................ | H01L 23/552 361/728 |

(Continued)

FOREIGN PATENT DOCUMENTS

| | | |
|---|---|---|
| JP | 07-240601 A | 9/1995 |
| JP | 2007-006198 A | 1/2007 |
| JP | 2012-205243 A | 10/2012 |

OTHER PUBLICATIONS

International Search Report and Written Opinion mailed Jun. 10, 2014.

*Primary Examiner* — Anthony Haughton
(74) *Attorney, Agent, or Firm* — Brundidge & Stanger, P.C.

(57) ABSTRACT

A high frequency circuit device that can avoid an occurrence of a stress concentration to a dielectric substrate during a temperature increase caused by a difference in coefficients of linear expansions of a chassis and a metal housing of a high frequency module is provided.

4 Claims, 6 Drawing Sheets

(56) References Cited

U.S. PATENT DOCUMENTS

2013/0258618 A1* 10/2013 Gomi .................. H01L 23/66
　　　　　　　　　　　　　　　　　　　　361/752

2014/0043745 A1* 2/2014 McCormack .......... G06F 13/00
　　　　　　　　　　　　　　　　　　　　361/679.09
2014/0078683 A1* 3/2014 Moran ............... H01R 13/7197
　　　　　　　　　　　　　　　　　　　　361/728

* cited by examiner

FIG. 7
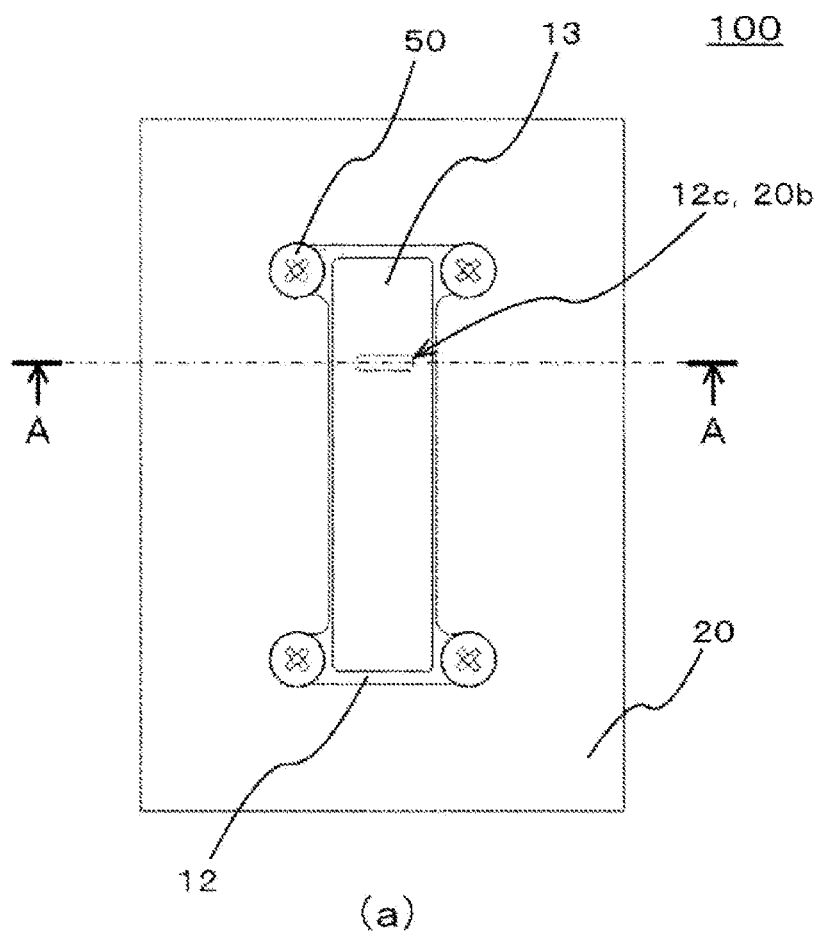
(a)
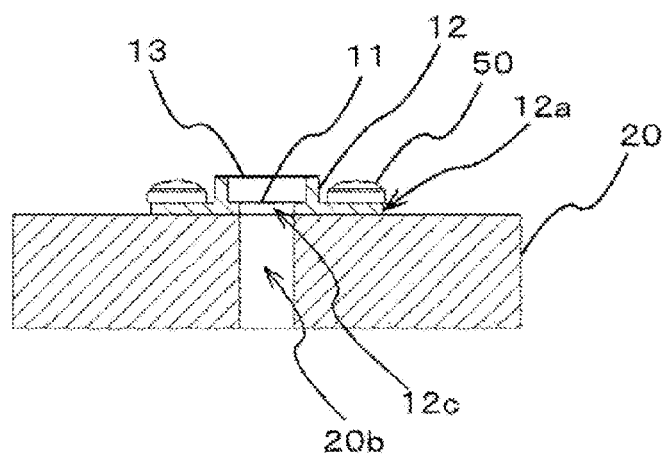
(b)

HIGH FREQUENCY CIRCUIT DEVICE

TECHNICAL FIELD

The present invention relates to a high frequency circuit device using a waveguide to transmit and receive a high frequency signal (3 GHz to 300 GHz) used in a micro wave band and a millimeter wave band.

BACKGROUND ART

In a micro wave band and a millimeter wave band, a waveguide which is a low-loss transmission path is widely used as an input and output interface with a transmission and reception antenna. For example, Patent Literature 1 explained below discloses a technique of a structure for realizing a lower-loss, wider bandwidth, and smaller high frequency circuit device used for a mobile wireless terminal, a video transmission, and the like for a submillimeter wave band and above.

In the technique disclosed in Patent Literature 1, a semiconductor for forming a high frequency circuit, a transmission path of a dielectric substrate, a metal electrode, and a ground metal electrode are provided in a ground metal housing, and a high frequency signal is retrieved to a waveguide through a rectangular hole having the same size as a wave guide provided in the metal housing.

CITATION LIST

Patent Literature

Patent Literature 1: JP 2007-006198 A

SUMMARY OF INVENTION

Technical Problem

The semiconductor, the dielectric substrate, and the like in the Patent Literature 1 can be sealed, as a high frequency module which can be mass-produced, into a ceramic package and the like using a ceramic material as a package base material. In a case where a waveguide is used as an input and output interface of the high frequency module formed with such ceramic package and the like, a structure for fastening the high frequency module to the waveguide connection metal material with screws has been employed as shown in FIGS. 6, 7(a), and 7(b) in the past.

A conventional high frequency circuit device having the structure for fixing the high frequency module to the waveguide connection metal material with screws will be explained with reference to FIGS. 6, 7(a), and 7(b).

FIG. 6 is a figure illustrating an example of a configuration of a conventional high frequency circuit device. FIG. 7(a) is a top view illustrating an external view of the high frequency circuit device of FIG. 6. FIG. 7 (b) is a cross sectional view taken along a plane A-A as shown in FIG. 7(a).

In FIG. 6, reference numeral 10 denotes a high frequency module having a transmission circuit function and a reception circuit function, and reference numeral 20 denotes a metal material, and in this example, the metal material 20 is a chassis made of metal. More specifically, the high frequency circuit device 100 of this example is constituted by the high frequency module 10 and the chassis 20. For example, a waveguide (not shown), serving as an input and output interface with a transmission and reception antenna, is attached to the chassis 20 and connected thereto. As shown in FIG. 6, the high frequency module 10 has such a structure that it is fastened to the chassis 20 with screws 50.

As shown in FIGS. 6, 7(a), and 7(b), in the high frequency module 10, reference numeral 11 denotes a dielectric substrate implemented inside of the high frequency module 10 and serving as a transmitter and receiver for exchanging a high frequency signal with a MMIC (monolithic micro wave integrated circuit) chip, not shown, and a waveguide, not shown. Reference numeral 12 is a metal housing made of alloy for accommodating the MMIC chip, the dielectric substrate 11, and the like therein. Reference numeral 13 is a metal lid body for sealing the metal housing 12 implemented with various kinds of components such as the MMIC chip, the dielectric substrate 11, and the like, and the material of the metal lid body 13 is the same as the metal housing 12.

The metal housing 12 is provided with a flange portion 12a having screw fixing hole portions 12b at four portions. A rectangular penetration hole 12c functioning as a waveguide unit is provided in a bottom surface where the dielectric substrate 11 inside of the metal housing 12 is implemented (connected and fixed), and a high frequency signal is retrieved through this penetration hole 12c to the outside.

In the chassis 20, reference numeral 20a is a screw hole for fastening the high frequency module 10 to the chassis 20 with screws, and the screw holes 20a are provided at positions corresponding to the screw fixing hole portions 12b at four positions of the metal housing 12 explained above. Reference numeral 20b denotes a penetration hole connected with the penetration hole 12c of the metal housing 12, and the penetration hole 20b passes a high frequency signal exchanged between the high frequency module 10 and the waveguide, not shown. The shape and the size of the penetration hole 20b are the same as or substantially the same as the shape and the size of the penetration hole 12c.

More specifically, the high frequency module 10 is fastened to the chassis 20 with screws so that the penetration hole 12c of the metal housing 12 matches the penetration hole 20b of the chassis 20, so that the penetration hole 12c and the penetration hole 20b function as the waveguide.

In this case, a case where the temperature of the entire high frequency circuit device 100 has increased $\Delta t$ degrees while the high frequency module 10 is fastened to the chassis 20 with screws, will be considered. When the heat for the temperature increase $\Delta t$ is applied to the chassis 20, and a thermal expansion occurs, a pitch L0 of the screw hole portions 20a of the chassis 20 before the thermal expansion as shown in FIG. 4 becomes $L1=(\alpha 1 \times L0 \times \Delta t)+L0$ ($\alpha 1$ denotes the coefficient of linear expansion of the chassis 20) after the thermal expansion, and an extension of $\alpha 1 \times L0 \times \Delta t$ occurs.

When the heat for the temperature increase $\Delta t$ is applied to the metal housing 12 of the high frequency module 10, and a thermal expansion occurs, a pitch L0 of the screw fixing hole portion 12b of the metal housing 12 before the thermal expansion as shown in FIG. 4 becomes $L2=(\alpha 2 \times L0 \times \Delta t)+L0$ ($\alpha 2$ denotes the coefficient of linear expansion of the metal housing 12) after the thermal expansion, and an extension of $\alpha 2 \times L0 \times \Delta t$ occurs.

For example, when the material of the chassis 20 is considered to be aluminum (a coefficient of linear expansion $\alpha 1=2.3 \times 10^{-5} K^{-1}$), and the material of the metal housing 12 of the high frequency module 10 is considered to be Kovar (a coefficient of linear expansion $\alpha 2=5.2 \times 10^{-6} K^{-1}$), there occurs a difference in the extension between the pitch L1 of the screw hole portion 20a of the chassis after the thermal expansion and the pitch L2 of the screw fixing hole portion 12b of the metal housing 12 after the thermal expansion.

More specifically, the coefficients of linear expansions α1, α2 are coefficients unique to the materials, and the coefficient of linear expansion α2 of the metal housing 12 of the high frequency module 10 and the coefficient of linear expansion α1 of the chassis 20 are different by about 4.4 times; therefore, the pitch L1 of the chassis 20 after the thermal expansion extends about 4.4 times longer than the pitch L2 of the metal housing 12 of the high frequency module 10 after the thermal expansion.

However, the metal housing 12 of the high frequency module 10 is fastened to the chassis 20 with the screws before the thermal expansion; therefore, a length of ΔL=L1−L2 cannot be extended between the chassis 20 and the metal housing 12 of the high frequency module 10 after the thermal expansion, and a stress is applied to the metal housing 12 of the high frequency module 10.

As described above, the dielectric substrate 11 is adhered and fixed to the inside of the metal housing 12; therefore, when a thermal expansion in the chassis 20 and the metal housing 12 occurs, the dielectric substrate 11 is forced to follow the thermal expansion of the metal housing 12, and a stress concentration occurs on the dielectric substrate 11 due to a stress applied to the metal housing 12 by the thermal expansion.

As described above, the high frequency module 10 and the chassis 20 are required to be fixed in such a manner that the penetration hole 12c of the metal housing 12 and the penetration hole 20b of the chassis 20 overlap each other; therefore, it is necessary to make the diameter of the screw fixing hole portion 12b of the metal housing 12 and the diameter of the screw hole portion 20a of the chassis 20 to be the same.

More specifically, when the high frequency module 10 and the chassis 20 are fastened with screws, there is no play between the diameter of the screw fixing hole portion 12b and the diameter of the screw hole portion 20a of the chassis 20; therefore, the thermal expansion occurs in the chassis 20 and the metal housing 12, so that a difference in the amount of extension of ΔL=L1−L2 due to the thermal expansion is directly applied to the metal housing as a stress, and a still larger stress concentration occurs in the dielectric substrate 11 and a crack is generated therein, and there is a problem in that the power is reduced and the radio performance is greatly affected.

The present invention is made to solve such problems, and it is an object of the present invention to provide a high frequency circuit device that can avoid an occurrence of a stress concentration to a dielectric substrate during a temperature increase caused by a difference in coefficients of linear expansions of a chassis and a metal housing of a high frequency module.

Solution to Problem

A high frequency circuit device according to an exemplary embodiment of the present invention for achieving the above object is a high frequency circuit device including a high frequency module and a waveguide connection metal material for attaching the high frequency module, wherein the high frequency module includes a dielectric substrate serving as a transmitter and receiver for exchanging a high frequency signal with a waveguide, a metal housing including a first penetration hole provided in an inside bottom surface where the dielectric substrate is implemented, and formed with a plurality of flange portions having screw fixing hole portions, and a metal lid body for sealing the metal housing, and wherein the waveguide connection metal material includes a screw hole for fastening the flange portion of the high frequency module with a screw, a second penetration hole formed to have substantially same shape and size as the first penetration hole to connect with the first penetration hole of the metal housing, and a first groove provided in a vicinity of the screw hole, wherein the high frequency module is fastened to the metal material with a screw so that the first penetration hole matches the second penetration hole, whereby, while the first penetration hole and the second penetration hole function as a waveguide, the first groove alleviates a stress concentration to the dielectric substrate caused by a thermal expansion of the metal housing during a temperature increase.

A high frequency circuit device according to an exemplary embodiment of the present invention for achieving the above object is based on the high frequency circuit device, wherein the first groove is a groove provided to surround the periphery of the screw hole by 180 degrees or more.

A high frequency circuit device according to an exemplary embodiment of the present invention for achieving the above object is based on the high frequency circuit device, wherein the waveguide connection metal material is provided with a second groove along a periphery in a longitudinal direction of the high frequency module, so that a stress concentration to the dielectric substrate caused by a thermal expansion of the metal housing during a temperature increase is alleviated.

A high frequency circuit device according to an exemplary embodiment of the present invention for achieving the above object is a high frequency circuit device including a high frequency module and a waveguide connection metal material on which the high frequency module is implemented, wherein the high frequency module includes a dielectric substrate serving as a transmitter and receiver for exchanging a high frequency signal with a waveguide, a metal housing including a first penetration hole provided in an inside bottom surface where the dielectric substrate is implemented, and formed with a plurality of flange portions having screw fixing hole portions, and a metal lid body for sealing the metal housing, and wherein the waveguide connection metal material includes a screw hole for fastening the flange portion of the high frequency module with a screw, a second penetration hole formed to have substantially same shape and size as the first penetration hole to connect with the first penetration hole of the metal housing, and a third groove provided around a middle of a longitudinal direction of the metal housing in such a manner that the third groove is perpendicular to the longitudinal direction of the metal housing, wherein the high frequency module is fastened to the metal material with a screw so that the first penetration hole matches the second penetration hole, whereby, while the first penetration hole and the second penetration hole function as a waveguide, the third groove alleviates a stress concentration to the dielectric substrate caused by a thermal expansion of the metal housing during a temperature increase.

Advantageous Effects of Invention

As described above, according to an exemplary embodiment of the present invention, a high frequency circuit device that can avoid an occurrence of a stress concentration to a dielectric substrate during a temperature increase caused by a difference in coefficients of linear expansions of a chassis and a metal housing of a high frequency module can be provided.

Further, according to an exemplary embodiment of the present invention, it is possible to avoid an occurrence of a stress concentration to a dielectric substrate while a high frequency module is fastened to a chassis with screws.

BRIEF DESCRIPTION OF DRAWINGS

FIG. 5(a) illustrates a specific example of a groove shape provided in the vicinity of a screw hole 2a.

FIG. 5(b) illustrates a specific example of a groove shape provided in the vicinity of a screw hole 2a.

FIG. 5(c) illustrates a specific example of a groove shape provided in the vicinity of a screw hole 2a.

FIG. 7(a) is a top view illustrating an external view of the high frequency circuit device of FIG. 6, and FIG. 7 (b) is a cross sectional view taken along a plane A-A as shown in FIG. 7(a).

DESCRIPTION OF EXEMPLARY EMBODIMENTS

<First Exemplary Embodiment>

Figure 1:
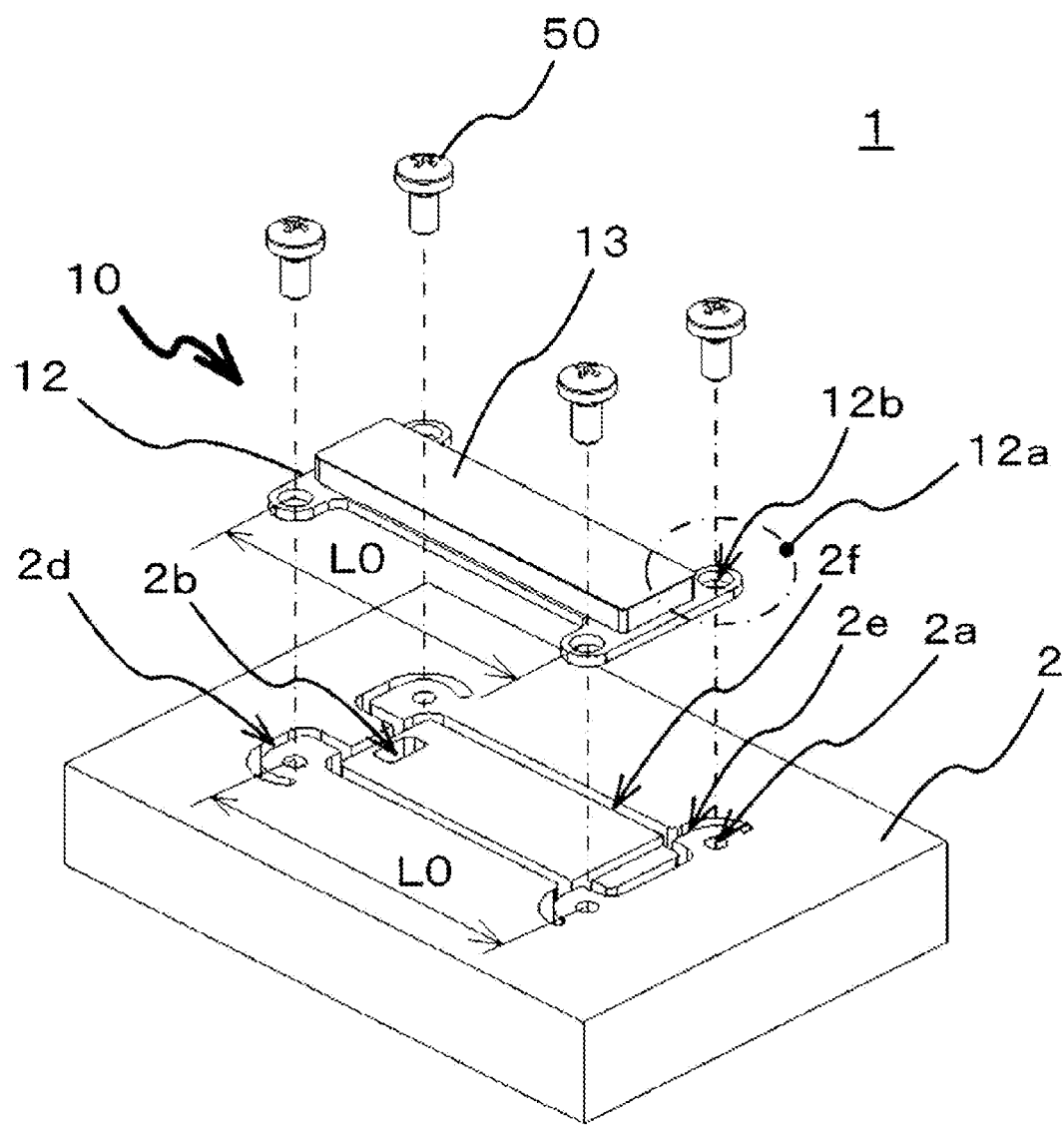
FIG. 1 is a perspective view illustrating an example of a configuration of a high frequency circuit device according to a first exemplary embodiment of the present invention.
Figure 2:
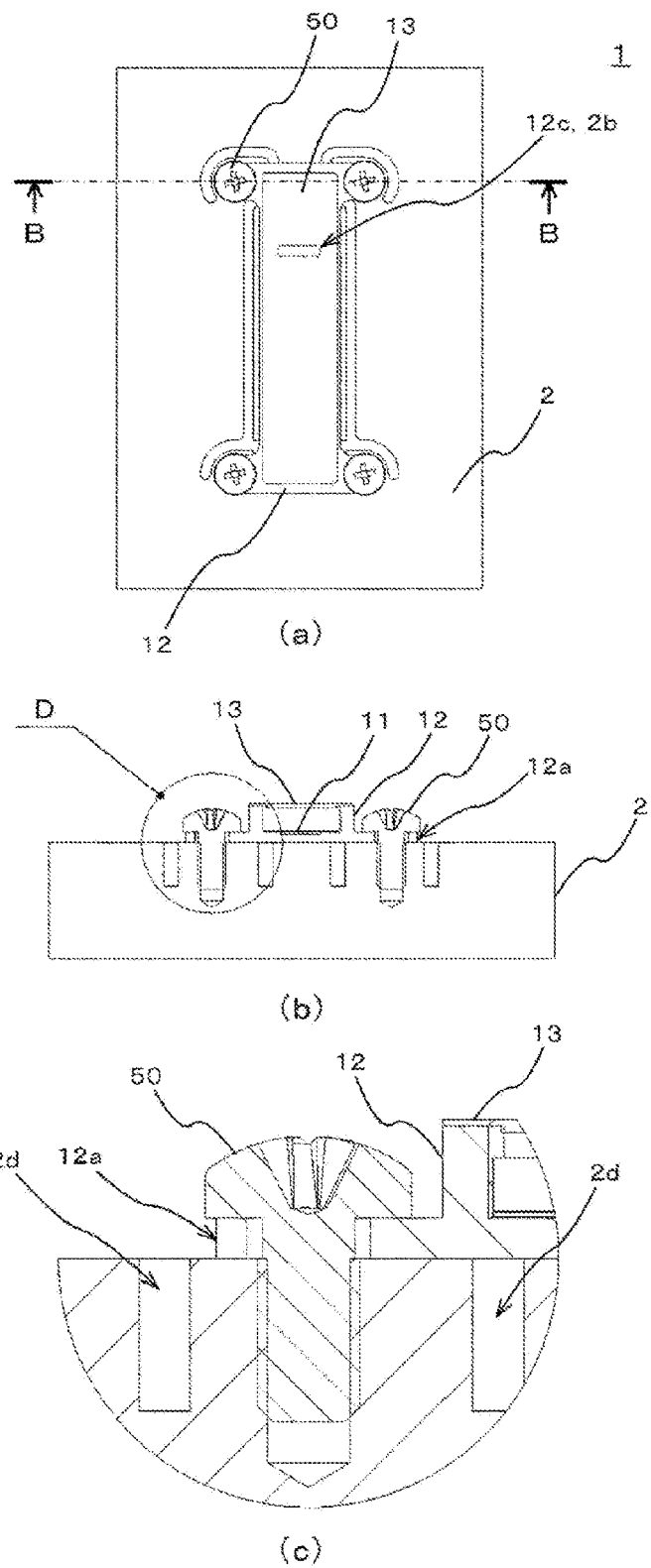
FIG. 2(a) is a top view illustrating an external view of the high frequency circuit device of FIG. 1.
FIG. 2(b) is a cross sectional view taken along a plane B-B as shown in FIG. 2(a)
FIG. 2(c) is a detailed diagram illustrating a portion D as shown in FIG. 2(b).

FIG. 1 is a perspective view illustrating an example of a configuration of a high frequency circuit device 1 according to a first exemplary embodiment of the present invention. FIG. 2(a) is a top view illustrating an external view of the high frequency circuit device 1 of FIG. 1. FIG. 2(b) is a cross sectional view taken along a plane B-B as shown in FIG. 2(a). FIG. 2(c) is a detailed diagram illustrating a portion D as shown in FIG. 2(b).

In FIGS. 1, 2(a), 2(b), and 2(c), reference numeral 10 denotes a high frequency module having a transmission circuit function and a reception circuit function, and reference numeral 2 denotes a metal material, and in this example, the metal material 2 is a chassis made of metal. More specifically, the high frequency circuit device 1 according to this example is constituted by the high frequency module 10 and the chassis 2. For example, a waveguide (not shown), serving as an input and output interface with a transmission and reception antenna, is attached to the chassis 2 and connected thereto. As shown in FIG. 1, the high frequency module 10 has such a structure that it is fastened to the chassis 2 with screws 50.

For example, when the material of the chassis 2 is considered to be aluminum (a coefficient of linear expansion $\alpha1=2.3\times10^{-5}K^{-1}$) and the like.

As shown in FIGS. 1, 2(a), 2(b), and 2(c), in the high frequency module 10, reference numeral 11 denotes a dielectric substrate implemented inside of the high frequency module 10 and serving as a transmitter and receiver for exchanging a high frequency signal with a MMIC (monolithic micro wave integrated circuit) chip, not shown, and a waveguide, not shown. Reference numeral 12 is a metal housing made of alloy for accommodating the MMIC chip, the dielectric substrate 11, and the like therein. Reference numeral 13 is a metal lid body for sealing the metal housing 12 implemented with various kinds of components such as the MMIC chip 5, the dielectric substrate 11, and the like, and the material of the metal lid body 13 is the same as the metal housing 12. For example, the materials of the metal housing 12 and the metal lid body 13 are Kovar (a coefficient of linear expansion $\alpha2=5.2\times10^{-6}K^{-1}$) and the like.

Figure 5:
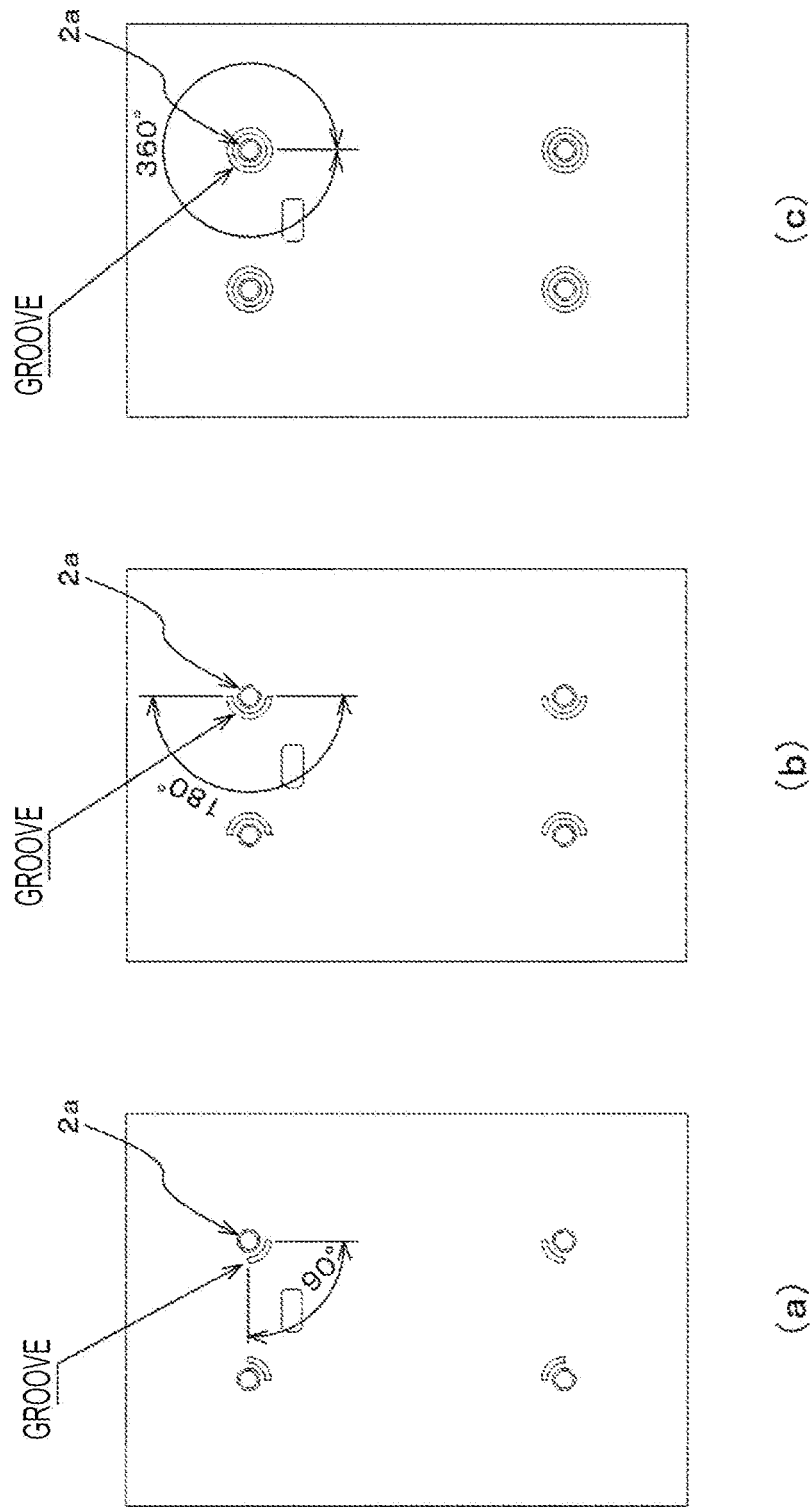

The metal housing 12 is provided with a flange portion 12a having screw fixing hole portions 12b at four portions. A rectangular penetration hole 12c functioning as a waveguide unit is provided in a bottom surface where the dielectric substrate 11 inside of the metal housing 12 is implemented (connected and fixed), and a high frequency signal is retrieved through this penetration hole 12c to the outside (see FIG. 5).

In the chassis 2, reference numeral 2a is a screw hole for fastening the high frequency module 10 to the chassis 2 with screws, and the screw holes 2a are provided at positions corresponding to the screw fixing hole portions 12b at four positions of the metal housing 12 explained above. Reference numeral 2b denotes a penetration hole connected with the penetration hole 12c of the metal housing 12, and the penetration hole 2b passes a high frequency signal exchanged between the high frequency module 10 and the waveguide, not shown. The shape and the size of the penetration hole 2b are the same as or substantially the same as the shape and the size of the penetration hole 12c.

More specifically, the high frequency module 10 is fastened to the chassis 2 with screws so that the penetration hole 12c of the metal housing 12 matches the penetration hole 2b of the chassis 2, so that the penetration hole 12c and the penetration hole 2b function as the waveguide.

As shown in FIG. 1, the chassis 2 has grooves 2d and grooves 2e provided in the vicinity of the screw holes 2a at four portions, and has grooves 2f along the external periphery of the high frequency module 10 in the longitudinal direction.

It should be noted that the groove 2d or the groove 2e provided in the vicinity of the screw holes 2a at the four portions are preferably provided on the entire periphery (360 degrees) of the vicinity of each of the screw holes 2a in the best case, but the groove 2d or the groove 2e provided in the vicinity of the screw holes 2a at the four portions may be configured to surround each of the screw holes 2a by 180 degrees or more.

In this exemplary case, a difference in a stress value applied to the dielectric substrate 11 in an exemplary case where the shape of the groove provided in the vicinity of the screw hole 2a is changed into various manners in the chassis 2 will be explained with reference to FIG. 4 and FIGS. 5(a) to 5(c).

Figure 4:
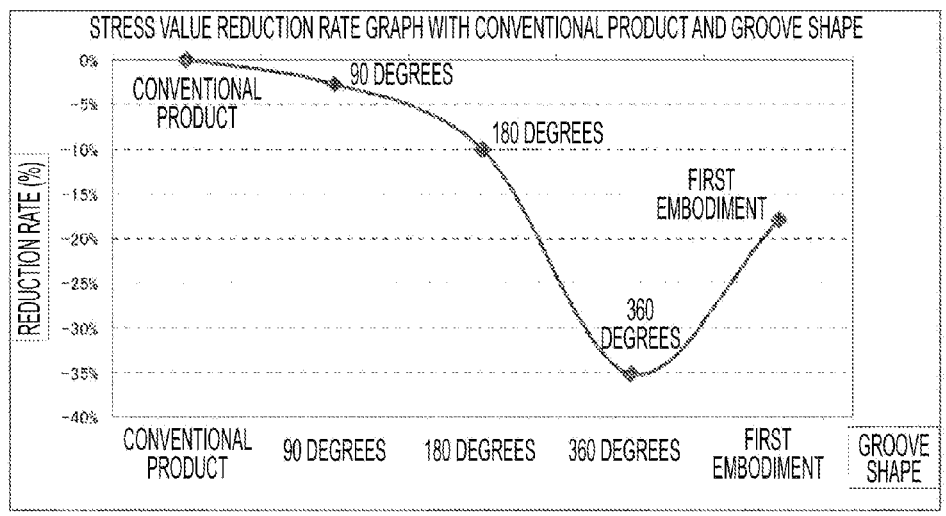
FIG. 4 is a graph based on a simulation analysis illustrating reduction rates of stress values in an exemplary case where a range (angle) where a groove is provided is changed, where the reduction rate of the stress value in an exemplary case where there is no groove around a conventional screw hole 2a is defined as zero.

FIG. 4 is a graph based on a simulation analysis illustrating reduction rates of stress values in an exemplary case where a range (angle) where a groove is provided is changed, where the reduction rate of the stress value in an exemplary case where there is no groove around a conventional screw hole 2a is defined as zero. FIGS. 5(a) to 5(c) are figures illustrating specific examples of groove shapes provided in the vicinity of the screw hole 2a. FIG. 5(a) illustrates an exemplary case of 90 degrees, FIG. 5(b) illustrates an exemplary case of 180 degrees, and FIG. 5(c) illustrates an exemplary case of 360 degrees.

As can be understood from the graph of FIG. 4, in an exemplary case where the range of the groove provided in the vicinity of the screw hole 2a is 360 degrees, the reduction rate of the stress value is the largest, e.g., about −35%. In an exemplary case where the range of the groove is 180 degrees, the reduction rate of the stress value is about −10%, and it is understood that the reduction rate of the stress value is larger than that in the exemplary case where the range of the groove is 90 degrees in which the reduction rate of the stress value is less than −5%. The reduction width of the reduction rate of the stress value is larger when the range of the groove is 180 degrees to 360 degrees than when the range of the groove is 90 degrees to 180 degrees. When the range of the groove provided in the vicinity of the screw hole 2a is of a larger angle, the reduction rate of the stress value increases, which is considered to enable avoiding a stress concentration to the dielectric substrate caused by a difference in the coefficient of linear expansion as explained later.

In this exemplary case, a case where the temperature of the entire high frequency circuit device 1 increases by Δt degrees while the high frequency module 10 is fastened to the chassis 2 with screws will be considered.

When the heat for the temperature increase Δt is applied to the metal housing 12 of the high frequency module 10, and a thermal expansion occurs, a pitch L0 of the screw fixing holes portion 12b of the metal housing 12 before the thermal expansion as shown in FIG. 1 becomes L2=(α2×L0×Δt)+L0 (α2 denotes the coefficient of linear expansion of the metal housing 12) after the thermal expansion, and an extension of α2×L0×Δt occurs.

In FIG. 1, when the grooves 2d and the grooves 2e provided in the vicinity of the screw holes 2a at four portions of the chassis 2 are not provided, or when the grooves 2f along the external periphery of the high frequency module 10 in the longitudinal direction are not provided, then, the heat for the temperature increase Δt is applied thereto and a thermal expansion occurs like the conventional chassis 20, so that the pitch L0 of the screw holes portion 2a of the chassis 2 before the thermal expansion becomes L1=(α1×L0×Δt)+L0 (α1 denotes the coefficient of linear expansion of the chassis 2) after the thermal expansion, and an extension of α1×L0×Δt occurs.

As described above, the material of the chassis 2 is aluminum (a coefficient of linear expansion α1=2.3×$10^{-5}K^{-1}$), and the material of the metal housing 12 of the high frequency module 10 is Kovar (a coefficient of linear expansion α2=5.2×$10^{-6}K^{-1}$), there occurs a difference in the extension between the pitch L1 of the screw hole portion 2a of the chassis 2 after the thermal expansion and the pitch L2 of the screw fixing hole portion 12b of the metal housing 12 after the thermal expansion.

More specifically, the coefficient of linear expansion α2 of the metal housing 12 of the high frequency module 10 and the coefficient of linear expansion α1 of the chassis 2 are different by about 4.4 times; therefore, the pitch L1 of the chassis 2 after the thermal expansion extends about 4.4 times longer than the pitch L2 of the metal housing 12 of the high frequency module 10 after the thermal expansion.

Therefore, the metal housing 12 of the high frequency module 10 is fastened to the chassis 2 with the screws before the thermal expansion; therefore, a length of ΔL=L1−L2 cannot be extended between the chassis 2 and the metal housing 12 of the high frequency module 10 after the thermal expansion, and a stress is applied to the metal housing 12 of the high frequency module 10.

As described above, the dielectric substrate 11 is adhered and fixed to the inside of the metal housing 12; therefore, when a thermal expansion occurs in the chassis 2 and the metal housing 12, the dielectric substrate 11 is forced to follow the thermal expansion of the metal housing 12, and a stress concentration occurs on the dielectric substrate 11 due to a stress applied to the metal housing 12 by the thermal expansion.

Figure 6:
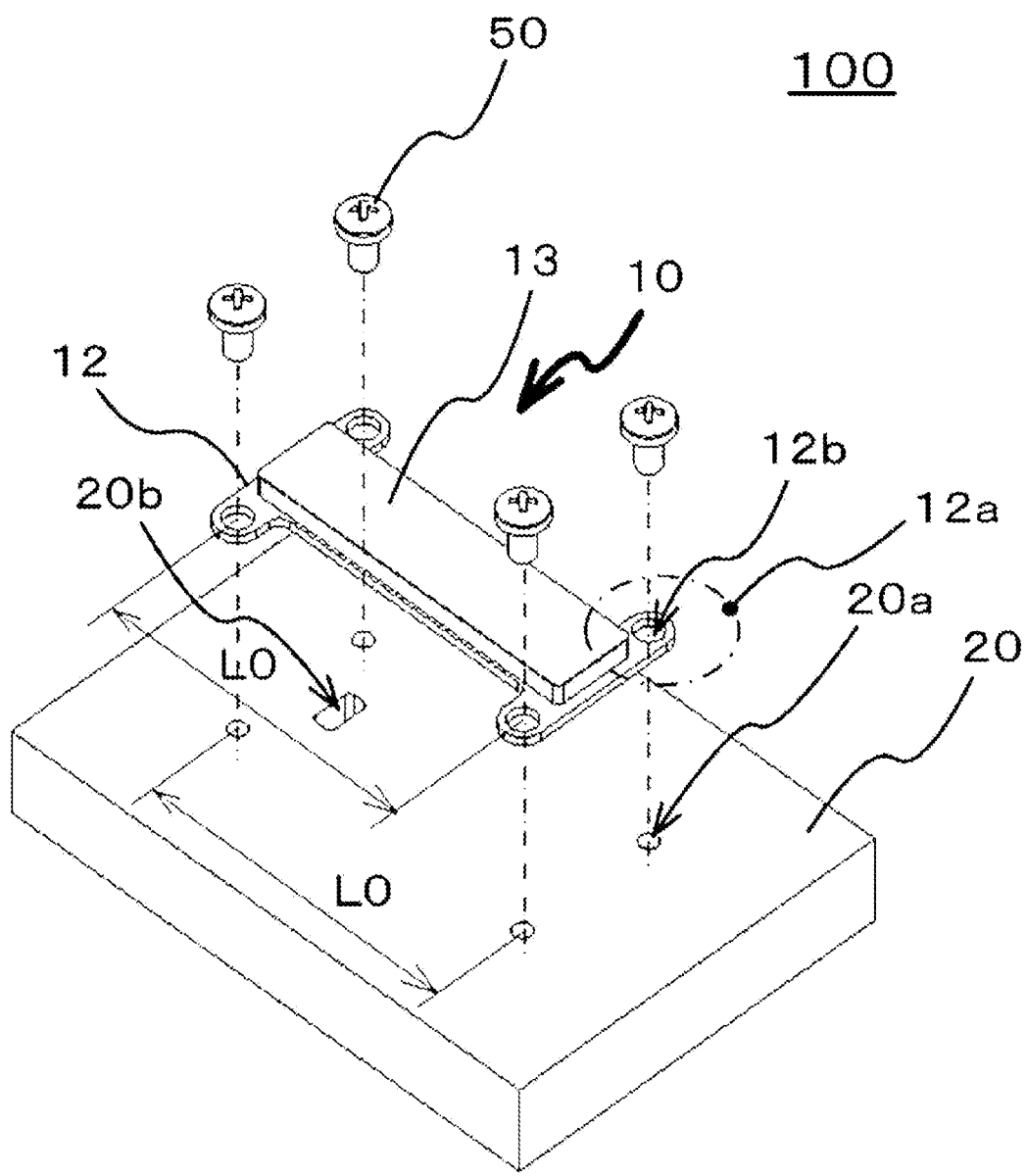
FIG. 6 is a figure illustrating an example of a configuration of a conventional high frequency circuit device.

However, with the high frequency circuit device 1 according to the first exemplary embodiment of the present invention, the grooves 2d, the grooves 2e, and the grooves 2f are provided on the chassis 2, so that this has the same effect as a gap made in view of also a difference in the amount of extension ΔL=L1−L2 between the pitch L1 of the chassis 2 after the thermal expansion and the pitch L2 of the high frequency module 10 after the thermal expansion, and when the stress applied to the dielectric substrate 11 is compared with that of the conventional product as shown in FIG. 6, the stress value is reduced by about 17.9%. In addition, the flange portion 12a of the metal housing 12 of the high frequency module 10 is fastened with the screws 50 to the screw holes 2a of the chassis 2, so that the behavior of the high frequency module 10 can be suppressed in the direction of the upper and lower sides and the left and the right.

As explained above, according to an exemplary embodiment of the present invention, a high frequency circuit device that can avoid an occurrence of a stress concentration to a dielectric substrate during a temperature increase caused by a difference in coefficients of linear expansions of a chassis and a metal housing of a high frequency module can be provided.

Further, according to an exemplary embodiment of the present invention, it is possible to avoid an occurrence of a stress concentration to a dielectric substrate while a high frequency module is fastened to a chassis with screws.

<Second Exemplary Embodiment>

Figure 3:
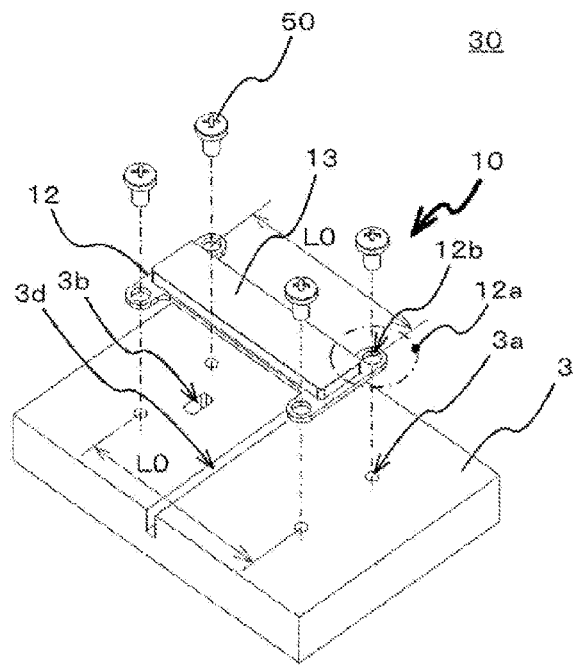
FIG. 3 is a perspective view illustrating an example of a configuration of a high frequency circuit device according to a second exemplary embodiment of the present invention.

FIG. 3 is a perspective view illustrating an example of a configuration of a high frequency circuit device 30 according to a second exemplary embodiment of the present invention.

In FIG. 3, reference numeral 10 denotes a high frequency module having a transmission circuit function and a reception circuit function, and reference numeral 3 denotes a metal material, and in this example, the metal material 2 is a chassis made of metal. More specifically, the high frequency circuit device 30 according to this example is constituted by the high frequency module 10 and the chassis 3. For example, a waveguide (not shown), serving as an input and output interface with a transmission and reception antenna, is attached to the chassis 3 and connected thereto. As shown in FIG. 3, the high frequency module 10 has such a structure that it is fastened to the chassis 3 with screws 50.

For example, when the material of the chassis 3 is considered to be aluminum (a coefficient of linear expansion α1=2.3×$10^{-5}K^{-1}$) and the like.

The high frequency module 10 has the same configuration as the high frequency module 10 of the high frequency circuit device 1 according to the first exemplary embodiment.

In the chassis 3, reference numeral 3a is a screw hole for fastening the high frequency module 10 to the chassis 3 with screws, and the screw holes 3a are provided at positions corresponding to the screw fixing hole portions 12b at four positions of the metal housing 12 explained above. Reference numeral 3b denotes a penetration hole connected with the penetration hole 12c of the metal housing 12, and the penetration hole 3b passes a high frequency signal exchanged between the high frequency module 10 and the waveguide, not shown. The shape and the size of the penetration hole 3b are the same as or substantially the same as the shape and the size of the penetration hole 12c.

More specifically, the high frequency module 10 is fastened to the chassis 3 with screws so that the penetration hole 12c of the metal housing 12 matches the penetration hole 3b of the chassis 3, so that the penetration hole 12c and the penetration hole 3b function as the waveguide.

As shown in FIG. 3, the chassis 3 has a groove 3d around the middle of the longitudinal direction of the metal housing 12 in such a manner that the groove 3d is perpendicular to the longitudinal direction of the metal housing 12.

In this exemplary case, a case where the temperature of the entire high frequency circuit device 30 increases by $\Delta t$ degrees while the high frequency module 10 is fastened to the chassis 3 with screws will be considered.

When the heat for the temperature increase $\Delta t$ is applied to the metal housing 12 of the high frequency module 10, and a thermal expansion occurs, a pitch L0 of the screw fixing holes portion 12b of the metal housing 12 before the thermal expansion as shown in FIG. 3 becomes $L2=(\alpha 2 \times L0 \times \Delta t)+L0$ ($\alpha 2$ denotes the coefficient of linear expansion of the metal housing 12) after the thermal expansion, and an extension of $\alpha 2 \times L0 \times \Delta t$ occurs.

In an exemplary case where there is no groove 3d provided around the middle of the chassis 3 in FIG. 3, the heat for the temperature increase $\Delta t$ is applied thereto and a thermal expansion occurs like the conventional chassis 20, so that the pitch L0 of the screw hole portion 3a of the chassis 3 before the thermal expansion becomes $L1=(\alpha 1 \times L0 \times \Delta t)+L0$ ($\alpha 1$ denotes the coefficient of linear expansion of the chassis 3) after the thermal expansion, and an extension of $\alpha 1 \times L0 \times \Delta t$ occurs.

As described above, in an exemplary case where the material of the chassis 3 is aluminum (a coefficient of linear expansion $\alpha 1=2.3 \times 10^{-5} K^{-1}$), and the material of the metal housing 12 of the high frequency module 10 is Kovar (a coefficient of linear expansion $\alpha 2=5.2 \times 10^{-6} K^{-1}$), there occurs a difference in the extension between the pitch L1 of the screw hole portion 3a of the chassis 3 after the thermal expansion and the pitch L2 of the screw fixing hole portion 12b of the metal housing 12 after the thermal expansion.

More specifically, the coefficient of linear expansion $\alpha 2$ of the metal housing 12 of the high frequency module 10 and the coefficient of linear expansion $\alpha 1$ of the chassis 3 are different by about 4.4 times; therefore, the pitch L1 of the chassis 3 after the thermal expansion extends about 4.4 times longer than the pitch L2 of the metal housing 12 of the high frequency module 10 after the thermal expansion.

Therefore, the metal housing 12 of the high frequency module 10 is fastened to the chassis 3 with the screws before the thermal expansion; therefore, a length of $\Delta L=L1-L2$ cannot be extended between the chassis 3 and the metal housing 12 of the high frequency module 10 after the thermal expansion, and a stress is applied to the metal housing 12 of the high frequency module 10.

As described above, the dielectric substrate 11 is adhered and fixed to the inside of the metal housing 12; therefore, when a thermal expansion occurs in the chassis 3 and the metal housing 12, the dielectric substrate 11 is forced to follow the thermal expansion of the metal housing 12, and a stress concentration occurs on the dielectric substrate 11 due to a stress applied to the metal housing 12 by the thermal expansion.

However, with the high frequency circuit device 30 according to the second exemplary embodiment of the present invention, the groove 3d is provided in the chassis 3, so that this has the same effect as a gap made in view of also a difference in the amount of extension $\Delta L=L1-L2$ between the pitch L1 of the chassis 3 after the thermal expansion and the pitch L2 of the high frequency module 10 after the thermal expansion, and when the stress applied to the dielectric substrate 11 is compared with that of the conventional product as shown in FIG. 6, the stress value is alleviated. In addition, the flange portion 12a of the metal housing 12 of the high frequency module 10 is fastened with the screws 50 to the screw holes 3a of the chassis 3, so that the behavior of the high frequency module 10 can be suppressed in the direction of the upper and lower sides and the left and the right.

As explained above, according to an exemplary embodiment of the present invention, a high frequency circuit device that can avoid an occurrence of a stress concentration to a dielectric substrate during a temperature increase caused by a difference in coefficients of linear expansions of a chassis and a metal housing of a high frequency module can be provided.

Further, according to an exemplary embodiment of the present invention, it is possible to avoid an occurrence of a stress concentration to a dielectric substrate while a high frequency module is fastened to a chassis with screws.

It should be noted that the present invention is not limited to the exemplary embodiments explained above as they are. When the present invention is carried out, it can be embodied upon modifying constituent elements without deviating from the gist thereof. Multiple constituent elements disclosed in the exemplary embodiments can be combined appropriately, and various modes may be formed. For example, some of constituent elements may be omitted from all the constituent elements disclosed in the exemplary embodiments. Further, constituent elements in different exemplary embodiments may be appropriately combined.

INDUSTRIAL APPLICABILITY

The present invention can be widely used for those implemented with an electric circuit that generates heat or that requires to be cooled, and can be used for, e.g., a radio communication device, a wireless measurement device such as a radar, a plasma application device, and a detector that is used by being cooled with liquid nitrogen and the like.

REFERENCE SIGNS LIST

1: high frequency circuit device, 2: chassis, 2a: screw hole portion, 2b: penetration hole, 2d: groove, 2e: groove, 2f: groove, 3: chassis, 3a: screw hole portion, 3b: penetration hole, 3d: groove, 10: high frequency module, 11: dielectric substrate, 12: metal housing, 12a: flange portion, 12b: screw fixing hole portion, 12c: penetration hole, 13: metal lid body, 20: chassis, 20a: screw hole portion, 20b: penetration hole, 30: high frequency circuit device, 50: screw, 100: high frequency circuit device

The invention claimed is:

1. A high frequency circuit device, comprising:
a high frequency module; and
a waveguide connection metal material configured to attach the high frequency module;
wherein the high frequency module includes:
a dielectric substrate serving as a transmitter and receiver configured to exchange a high frequency signal with a waveguide,
a metal housing including a first penetration hole provided in an inside bottom surface where the dielectric substrate is implemented, and formed with a plurality of flange portions having screw fixing hole portions, and
a metal lid body configured to seal the metal housing;
wherein the waveguide connection metal material includes:
a screw hole configured to fasten the flange portion of the high frequency module with a screw,
a second penetration hole formed to have a substantially same shape and size as the first penetration hole to connect with the first penetration hole of the metal housing, and
a first groove provided in a vicinity of the screw hole; and
wherein the high frequency module is fastened to the metal material with the screw so that the first penetration hole matches the second penetration hole, wherein in response to the first penetration hole and the second penetration hole functioning as a waveguide, the first groove alleviates a stress concentration to the dielectric substrate caused by a thermal expansion of the metal housing during a temperature increase.

2. The high frequency circuit device of claim 1, wherein the first groove is configured to surround the periphery of the screw hole by 180 degrees or more.

3. The high frequency circuit device of claim 1, wherein the waveguide connection metal material includes a second groove along a periphery in a longitudinal direction of the high frequency module, so that a stress concentration to the dielectric substrate caused by a thermal expansion of the metal housing during a temperature increase is alleviated.

4. A high frequency circuit device, comprising:
a high frequency module; and
a waveguide connection metal material on which the high frequency module is implemented;
wherein the high frequency module includes:
a dielectric substrate serving as a transmitter and receiver configured to exchange a high frequency signal with a waveguide,
a metal housing including a first penetration hole provided in an inside bottom surface where the dielectric substrate is implemented, and formed with a plurality of flange portions having screw fixing hole portions, and
a metal lid body configured to seal the metal housing;
wherein the waveguide connection metal material includes:
a screw hole configured to fasten the flange portion of the high frequency module with a screw,
a second penetration hole formed to have substantially same shape and size as the first penetration hole to connect with the first penetration hole of the metal housing, and
a third groove provided around a middle of a longitudinal direction of the metal housing, wherein the third groove is substantially perpendicular to the longitudinal direction of the metal housing; and
wherein the high frequency module is fastened to the metal material with the screw so that the first penetration hole matches the second penetration hole, wherein in response to the first penetration hole and the second penetration hole functioning as a waveguide, the third groove alleviates a stress concentration to the dielectric substrate caused by a thermal expansion of the metal housing during a temperature increase.

* * * * *